United States Patent
Syrjärinne

(10) Patent No.: US 6,618,690 B1
(45) Date of Patent: Sep. 9, 2003

(54) GENERALIZED POSITIONING SYSTEM BASED ON USE OF A STATISTICAL FILTER

(75) Inventor: Jari Syrjärinne, Tampere (FI)

(73) Assignee: Nokia Mobile Phones Ltd, Espoo (FI)

( * ) Notice: Subject to any disclaimer, the term of this patent is extended or adjusted under 35 U.S.C. 154(b) by 0 days.

(21) Appl. No.: 09/443,259

(22) Filed: Nov. 22, 1999

(51) Int. Cl.⁷ .............................................. H04B 7/185
(52) U.S. Cl. ..................................... 702/179; 455/13.1
(58) Field of Search ................................ 702/179, 150, 702/152, 153, 181, 183, 187, 188; 455/3.01, 3.02, 12.1, 13.1, 24, 98, 115; 706/17, 21; 701/207, 213, 226; 342/118, 135, 352, 357.01, 357.03, 357.08; 708/300

(56) References Cited

U.S. PATENT DOCUMENTS

| | | | |
|---|---|---|---|
| 3,795,911 A | * 3/1974 | Hammack | 342/106 |
| 4,535,625 A | 8/1985 | Lyle, Jr. | 73/152 |
| 5,381,095 A | 1/1995 | Andrews | 324/326 |
| 5,526,357 A | * 6/1996 | Jandrell | 370/346 |
| 5,828,336 A | 10/1998 | Yunck et al. | |
| 5,883,595 A | 3/1999 | Colley | 342/357 |
| 5,890,068 A | 3/1999 | Fattouche et al. | |
| 6,127,968 A | * 10/2000 | Lu | 342/357.03 |
| 6,380,934 B1 | * 4/2002 | Freeman et al. | 345/419 |
| 6,417,802 B1 | * 7/2002 | Diesel | 342/357.14 |

OTHER PUBLICATIONS

European Patent Office Search Report dated Mar. 15, 2002 (3pp).

"Multitarget–Multisensor Tracking Principles and Techniques," Y. Bar–Shalon pp. 1, 46 and 20, 1995.

"An Introduction to the Kalman Filter," Welch et al., pp. 1–16, Sep. 17, 1997.

* cited by examiner

Primary Examiner—Marc S. Hoff
Assistant Examiner—Edward Raymond
(74) Attorney, Agent, or Firm—Ware, Freesola, Van Der Sluys & Adolphson LLP

(57) ABSTRACT

A generalized positioning system, corresponding method, and filter for use in the generalized positioning system, based on Kalman filtering or any other kind of filtering that produces an estimate of position, or other aspect of the motion of an object, using statistical measures involving current and previous measurements of position or any other aspect of the motion of the object, but with greater responsiveness than a positioning system based on the usual statistical filtering, such as Kalman filtering. The generalized positioning system uses a calculated association probability for each measurement in a set of measurements of position (or other aspect of the motion) at a particular instant of time, the association probabilities being used in the calculation of a combined measurement innovation (residual), which is in turn used in calculating the next estimate of position (or other motion state information). In one aspect of the invention, a pre-validation is performed, based on a usually pre-determined gate width of a validation region. By using a combined measurement innovation, the generalized positioning system is able to accept simultaneous measurements from different sources of information, including different kinds of sources of information, so that it can provide position estimates (or estimates for other components of the state of motion, i.e. of other aspects of the motion) based on, e.g., information received both from satellites, used in a global positioning system, and also from cellular base station in a cellular telephone network.

23 Claims, 4 Drawing Sheets

GENERALIZED POSITIONING SYSTEM BASED ON USE OF A STATISTICAL FILTER

FIELD OF THE INVENTION

The present invention relates generally to any system that estimates one or another aspect of the motion of an object, such as position. More particularly, the present invention pertains to the application of statistical filters, such as a Kalman filter, in such generalized positioning systems.

BACKGROUND OF THE INVENTION

A satellite positioning system (SATPS) receiver generally determines its positions by triangulating its Line of Sight (LOS) range to several satellites or space vehicles. A GPS receiver, for example, computes a 4-dimensional solution involving latitude, longitude, altitude, and time using the LOS ranges to as few as four satellites. The accuracy of the solution is a direct function of the accuracy of the range measurements.

SATPS receivers are growing rapidly in popularity and application. GPS receivers, for example, are now common in aviation, marine, and terrestrial applications. An increasingly common terrestrial application for GPS receivers is in automobiles. In the automotive context, the vehicle's location is typically displayed on an electronic display of a street map. It is vital in this context, therefore, to provide the driver with continuously updated position solutions, collectively called a "ground track," that accurately track the vehicle's movement from one moment to the next. Experience shows that consumers consider ground-track fidelity as one of the most important criteria in choosing a receiver. It is extremely important, therefore, that the ground-track displayed on the GPS receiver's electronic map not have spurious jumps, stair steps, spikes, jigs, or jogs that are unrelated to the vehicle's actual path.

There are a number of factors, however, that may cause discontinuities in the position solutions used to determine the ground-track of an automotive SATPS receiver. One source of position solution discontinuity is "Selective Availability" (SA), which restricts the accuracy of civilian GPS receivers to roughly 100 meters. SA is intentionally used by the U.S. Government for purposes of national security. The Department of Defense (DOD) implements SA by purposely injecting error into the satellite range signals.

Another common source of position solution discontinuity is due to the phenomenon known as multi-path, where the true LOS signal from a given satellite reaches the GPS receiver's antenna, along with additional signals providing supposedly the same information, the additional signals caused by reflection from nearby objects, such as buildings or cliffs. The multi-path phenomenon is particularly troublesome for automotive receivers because they are frequently used in cities and surrounded by tall buildings. This environment is sometimes called an "urban canyon" due to the canyon-like setting it resembles. Regardless of source, multi-path can be a very vexing problem because the additional signals may be very strong, but very wrong.

Yet another source of position solution discontinuity is that the constellation of satellites used by a SATPS receiver can change; the SATPS receiver may see a different constellation of satellites from one moment to the next. If the GPS receiver is located in an urban canyon environment, for example, individual satellites may become blocked and later unblocked as the receiver moves past different buildings. The discontinuity arises in this situation because the error in a position solution is based on the constellation of satellites used. (Two satellites located in approximately the same direction will provide position information with larger error than two satellites in very different directions, all other things being equal.) If the position solution provided by a GPS receiver is suddenly based on a different constellation, the different error may cause a jump or discontinuity in position.

It is known in the art to use a Kalman filter to account for the uncertainties in measurement data provided to a positioning system. FIG. 1 is a simplified flow diagram of a conventional GPS-type positioning system 10 including an RF antenna 11, a measurement engine 12 and a Kalman filter 14, providing a position estimate $\hat{x}(k)$ for position at time instant k. The measurement engine 12 receives RF signals from a plurality of orbiting satellites via the antenna 11 and provides the Kalman filter 14 with measured position and velocity, i.e. measured state information as opposed to the predicted state information provided buy the Kalman filter based on the measured values.

The construction of the measurement engine 12 varies from application to application. Generally, the measurement engine 12 contains the analog electronics (e.g. preamplifiers, amplifiers, frequency converters, etc.) needed to pull in the RF signal, and further includes a code correlator for detecting a particular GPS code corresponding to a particular satellite. The measurement engine 12 estimates the line of sight (LOS) range to a detected satellite using a local, onboard GPS clock and data from the satellite indicating when the satellite code was transmitted. The LOS ranges determined this way are called pseudo-ranges because they are only estimates of the actual ranges, based on the local detection time. In the positioning system 10 of FIG. 1, the measurement engine 12 converts the pseudo-ranges it acquires over time to measurements $z(k)$ of the state of the process, i.e. to a position and velocity of the moving object whose position is being determined.

Further it is known in the art that it is advantageous to smooth measurement data provided to a Kalman filter used in a positioning system. Colley (U.S. Pat. No. 5,883,595) discloses a method of smoothing Kalman filter position states forming a ground-track in a receiver used in a satellite based positioning system. In such systems, data pairs including an incoming value and a "raw" reliability estimate (e.g. a standard deviation) are normally fed directly to the Kalman Filter. The Kalman filter computes the resultant and an overall uncertainty estimate by applying a weight to each successive incoming, measurement value based on its reliability. The Kalman filter also estimates incoming values based on past values. The method of Colley involves the steps of replacing the raw reliability with a modified reliability if the incoming value is too far from the estimate in view of an adjustable limit envelope defined by the current uncertainty estimate and reliability value. If the difference is small, however, then the reliability value is passed without modification. The modified reliability value is preferably scaled or decreased in proportion to the amount by which the square of the incoming value is outside of the limit envelope.

While the Colley invention is potentially advantageous compared to using a standard Kalman filter, the pre-processing of the measurement data is based on ad hoc values associated with the adjustable limit envelope. What is needed is a way to provide for what is essentially automatic, dynamical tuning of a Kalman filter used in a positioning system, based on statistical measures of the error of incoming measurements.

Further what is needed, ideally, is a source of measurement data (used to determine pseudo-ranges and pseudorates) that does not suffer from the same errors as affect satellite measurement data. Such a second source of measurement data would presumably not usually be in error simultaneously with, or in the same way as satellite data. It is expected that information similar to what is provided by satellites will soon be provided by base stations of cellular systems. The W-CDMA (cellular) system, now being developed, already provides cell identifiers, enabling positioning based on the identifiers. The main sources of noise and inaccuracy in such cellular-provided information are not the same as for satellites; instead of atmosphere, multi-path, and selective availability, error in a cellular system is caused by obstacles in the signal path, range measurement quantization, and interfering frequencies.

Even though the use of two different types of sources of positioning measurements can provide an inherently more reliable positioning system, it is still true that at any instant of time a particular measurement can be greatly impaired by-one or another source of error (not usually the selective diversity, which is intended only to "dither" the correct measurement). Thus, it remains advantageous, even in case of a hybrid positioning system (hybrid in the sense of different kinds of sources of measurement), to provide a way for automatic, dynamical tuning of a Kalman filter used in a positioning system, based on statistical measures of the error of measurements.

SUMMARY OF THE INVENTION

Accordingly, the present invention provides an improved generalized positioning system, for making estimates of state information of an object, the state information being information about the state of motion of the object, having a filter that statistically determines a succession of state estimates along with corresponding uncertainty estimates based on a succession of state measurements, the improvement comprising: means for determining association probabilities for a plurality of state measurements all at a same instant of time, each association probability corresponding to a particular state measurement at the instant of time, and also means for determining an association probability providing a value for the probability that none of the plurality of measurements is correct; means for combining into a single measurement innovation each individual innovation using the association probabilities as weightings; and means for determining the covariance of the updated state based on the individual association probabilities, the association probability for providing a value for the probability that none of the measurements is correct, and the combined measurement innovation.

In a further aspect of the invention, the filter is responsive to measurements provided by a measurement engine receiving information from both satellites and cellular base stations.

In a still further aspect of the invention, the filter is responsive to a finite gate width of a validation region, and, in addition, the filter rejects a state measurement if it falls outside the validation region.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

In the best mode, the present invention is part of a receiver used in a Kalman filter or similar filter as part of a positioning (navigation) system. It is to be understood, however, that the present invention can be used not only with a Kalman filter in such a system, but with any kind of filter in a position-measuring system (or in a system that measures another aspect of the motion of an object, such as velocity) where the filter is used in producing an estimate of position based on statistical measures involving current and previous measurements of position, or in other words, with any kind of filter that statistically determines a succession of position estimates along with corresponding uncertainty estimates based on a succession of measurements.

Background on Standard Kalman Filter and Notation Used

Figure 1:
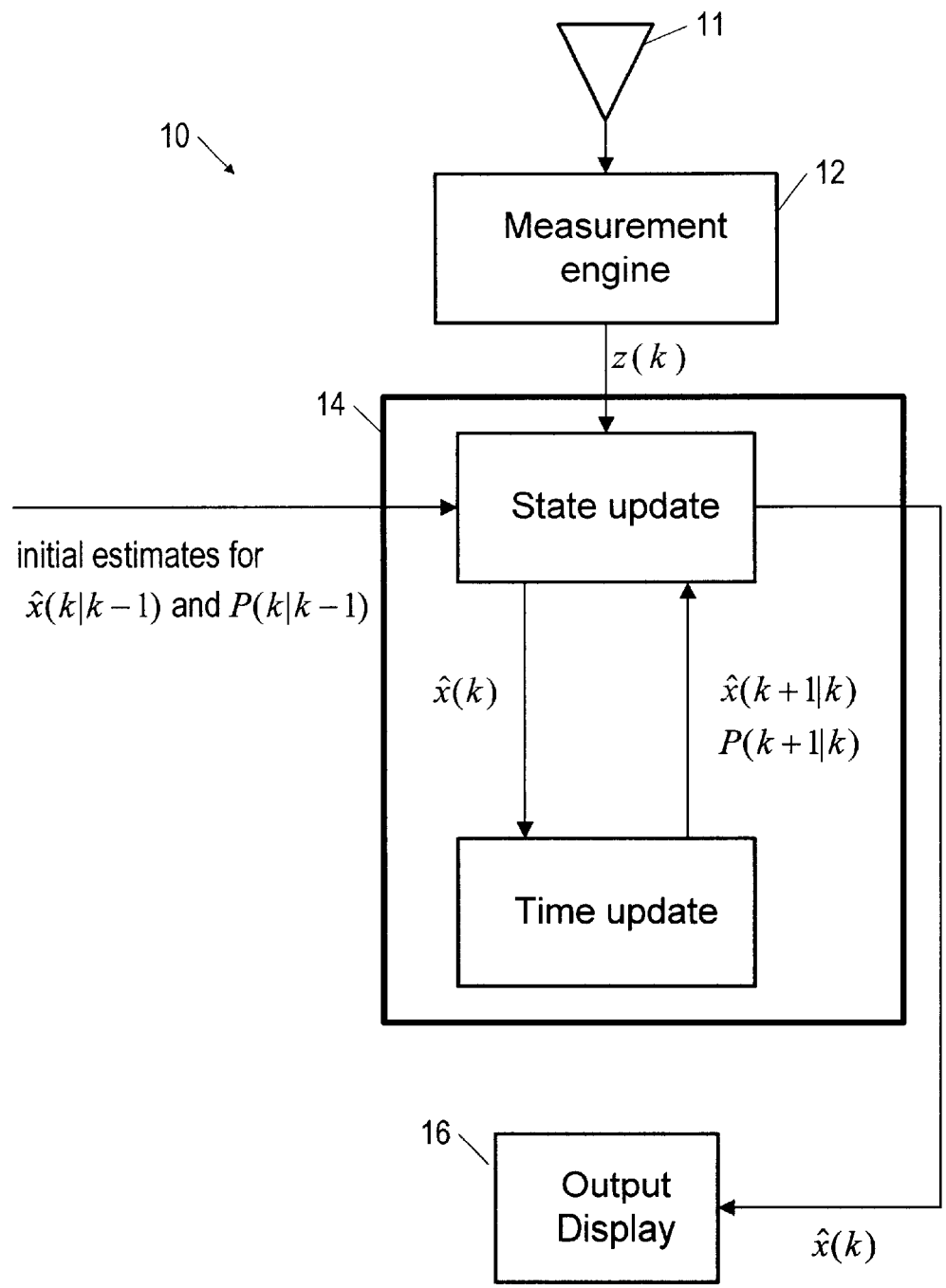
FIG. 1 is a flow diagram/block diagram of a positioning system based on a Kalman filter.

Referring again to FIG. 1, in a positioning system 10 according to the prior art, a Kalman filter 24 is sometimes used to estimate the state x(k) of a process, such as the position and velocity of a vehicle in motion, based on measurements related to the process. The (unknown and never perfectly knowable) state x(k) of a discrete-time controlled process is assumed governed by a dynamical equation cast as the linear stochastic difference equation:

$$x(k+1)=A(k)x(k)+Bu(k)+w(k) \quad (1)$$

where w(k) is the process noise, A(k) is an n×n matrix relating the state at time step k to the state at time step k+1 in the absence of a driving function, u(k) is a control input to the state x, and B is an n×l matrix that relates the control input to the state x.

Measurement z(k) (i.e. the measured position at time instant k) is assumed to correspond to the state x(k) (i.e. the actual position at time instant k) according to the equation:

$$z(k)=H(k)x(k)+s(k) \quad (2)$$

where s(k) is the measurement noise, and the m×n matrix H relates the state x(k) to the measurement z(k). The measurement z(k) is provided by a measurement engine 22 based on information received by an antenna 21.

The Kalman filter uses the measurements z(k), along with knowledge of the dynamical equation (eq. 1), to determine an a posteriori estimate $\hat{x}(k|k-1)$ that takes into account the measurements z(k) more or less, depending on a Kalman gain, K(k), calculated as described below. The estimate $\hat{x}(k|k-1)$ is said to be a posteriori in that it is made after the measurements z(k), taking those measurements into account.

A central assumption in using a Kalman filter is that the process noise and the measurement noise are both white, and with normal probability distributions:

$$p(w(k)) \sim N(0, Q(k)) \quad (3)$$

$$p(s(k)) \sim N(0, R(k)) \quad (4)$$

where Q(k) is the process noise covariance (matrix), and R(k) is the measurement error covariance (matrix). (Here, N(a,b) is the normal distribution with mean a and covariance b.) In the implementation of a Kalman filter, the R(k) and Q(k) for the filter are sometimes measured, or values are assumed, once and for all before using the filter. The selection of values to be used for R(k) and Q(k) is said to constitute "tuning" the filter, and is sometimes performed off-line, using another Kalman filter. In some applications, R(k) and Q(k) are taken to be constant.

Referring again to FIG. 1, the operation of a Kalman filter, in general, is in two parts: a time update part and a measurement update part. In the time update part, the output of the Kalman filter (i.e. the a posteriori estimated state $\hat{x}(k)$) is used in the assumed dynamical equation (1) to determine an a priori estimate $\hat{x}(k+1|k)$ of the next state of the process:

$$\hat{x}(k+1|k) = A(k)\hat{x}(k) + Bu(k) \quad (5)$$

Here, the notation $\hat{x}(k+1|k)$ is used to show expressly that the value obtained is based on assuming the a posteriori estimate $\hat{x}(k)$.

The time update part also determines the so-called a priori estimate error covariance using the equation:

$$P(k|k-1) = A(k)P(k-1)A^T(k) + Q(k) \quad (6)$$

where the a priori estimate error covariance $P(k|k-1)$ is based on the a priori estimate error $x(k) - \hat{x}(k|k-1)$, and is defined as:

$$P(k|k-1) = E[(x(k) - \hat{x}(k|k-1))(x(k) - \hat{x}(k|k-1))^T] \quad (7)$$

in which E(a) is the expectation of the random variable a, and where P(k) is the corresponding a posteriori estimate error covariance, based on the a posteriori estimate error $x(k) - \hat{x}(k)$.

In the second, measurement update part of the operation of a Kalman filter, the Kalman gain $K(k+1)$ is calculated, using:

$$K(k+1) = P(k+1|k)H^T(k+1)[H(k+1)P(k+1|k)H^T(k+1) + R(k+1)]^{-1} \quad (8)$$

and is then used to determine the a posteriori state estimate $\hat{x}(k+1)$, according to:

$$\hat{x}(k+1) = \hat{x}(k+1|k) + K(k+1)v(k+1) \quad (9)$$

where $v(k+1)$ is the so-called measurement innovation (or measurement residual), defined as:

$$v(k+1) = z(k+1) - H(k+1)\hat{x}(k+1|k) \quad (10)$$

The estimate $\hat{x}(k+1)$ is then output to an output display 16 as the Kalman filter's estimate of the state of the process as the time corresponding to k+1, and is also used in the next first, time update part of the operation of the Kalman filter. Finally, the first, update part of the operation also requires a new a posteriori estimate error covariance, P(k+1), which is calculated using:

$$P(k+1) = [I - K(k+1)H(k+1)]P(k+1|k) \quad (11)$$

The operation of the Kalman filter must of course be started with initial estimates for $\hat{x}(k+1|k)$ and for $P(k+1|k)$, and the prior art includes suggestions for how to select initial values.

Kalman Filter With Probabilistic Data Association

Figure 2:
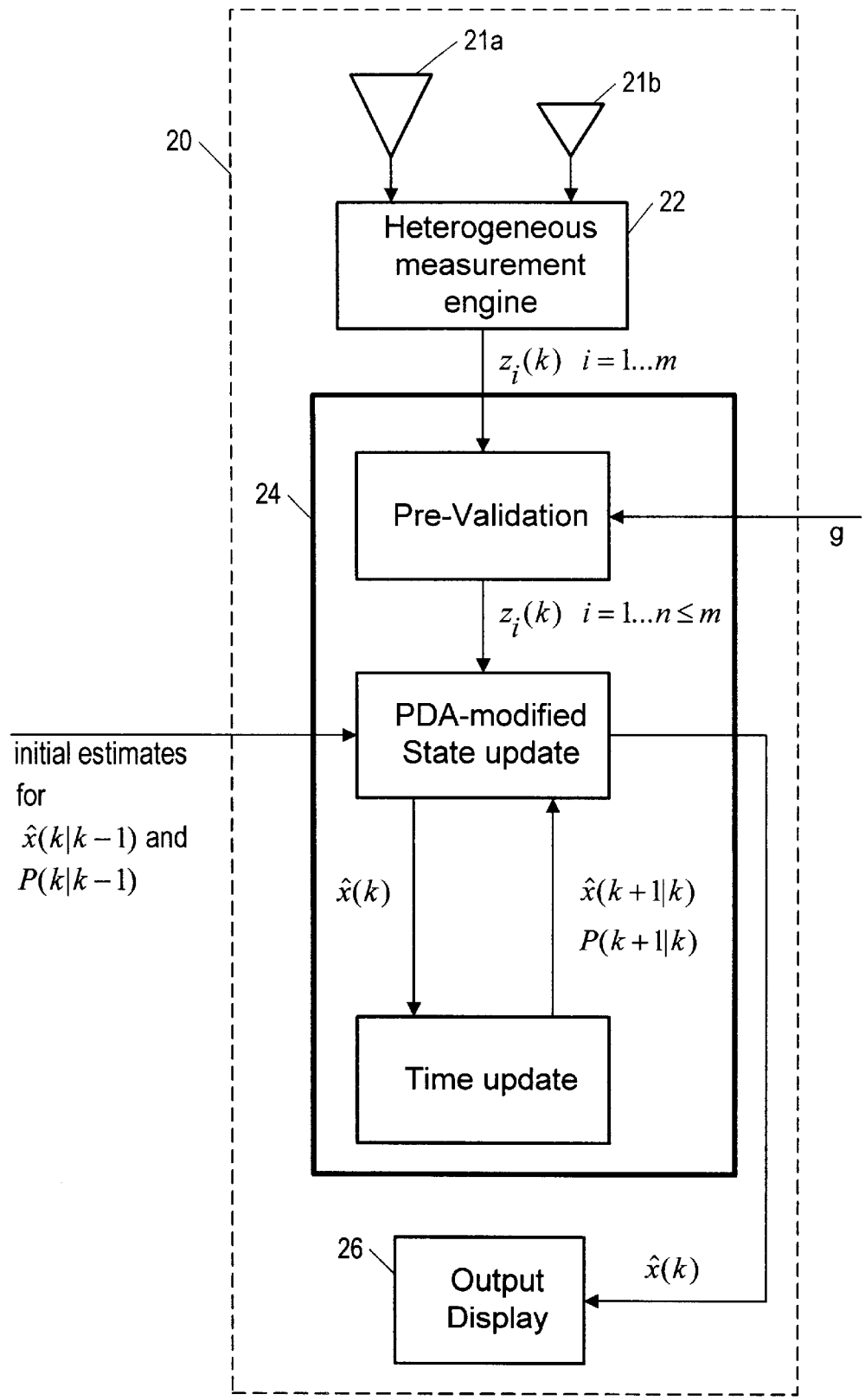
FIG. 2 is a flow diagram/block diagram of a positioning system based on a statistical filter with statistical preprocessing of inputs, according to the present invention.

Referring now to FIG. 2, in the present invention, a positioning system 20 uses a Kalman filter 24 modified to use probabilistic data association (PDA), so as to enable using a combination of measurements at each instant of time for which a time update and then a measurement update is performed. In the preferred embodiment, up to m different measurements $Z_1(k), Z_2(k), \ldots, Z_m(k)$ are provided by a heterogeneous measurement engine 22 at each instant k of time, based on information received by different antennae 21a and 22b, which are different in kind in that one is intended to receive information from one kind of source of information, such as satellites, and the other is intended to receive information from another kind of source of information, such as cellular base stations.

A moving object carrying such a positioning system can use, as sources of measurement, both cellular and satellite data in determining an estimate of position, and can use multiple measurements of the position, at the same instant of time, from each source.

According to the present invention, it is assumed that the probability density function of the object's state estimate $\hat{x}(k)$ (i.e. the object's position and velocity), as provided by the Kalman filter of the present invention, is normally distributed when conditioned on the set Z(k−1) of all previous measurements up to the (k−1)th instant of time, i.e. that $$p[\hat{x}(k)|Z(k-1)] = N[\hat{x}(k); \hat{x}(k|k-1), P(k|k-1)] \quad (12a)$$

which corresponds to the assumptions indicated as equations (3) and (4). It is further assumed that all measurement innovations (residuals) $v_j(k)$ are also normally distributed when conditioned on all previous measurements Z(k−1), i.e. that $$p[v_j(k)|Z(k-1)] = N[v_j(k); 0, P(k|k-1)] \quad (12b)$$

the mean taken to be zero since the measurement noise is assumed to be white. Under these assumptions, association probabilities (i.e. associated with measurements) are determined according to:

$$\beta_j(k) = e_j(k)\left[b(k) + \sum_{j=1}^{m(k)} e_j(k)\right]^{-1} \quad (13)$$

for j=1 ... m(k), where m(k) is the number of measurements; where $$e_j(k) = P_G^{-1} N[v_j(k); 0, S(k)] \quad (14)$$

in which $v_j(k)$ is the measurement innovation for the $j^{th}$ measurement and S(k) is the innovation covariance at instant k, i.e. $S(k) = H(k)P(k|k-1)H^T(k) + R(k)$; where $$b(k) = m(k)(1 - P_D P_G)[P_D P_G V(k)]^{-1} \quad (15)$$

in which V(k) is the volume of a validation region, described below (equation 17); and where a special association probability is defined corresponding to the probability that none of the measurements is correct (or, equivalently, the probability that at least one measurement is correct, subtracted from one), given by $$\beta_0(k) = b(k)\left[b(k) + \sum_{j=1}^{m(k)} e_j(k)\right]^{-1}. \quad (16)$$

Note that the Kalman gain K(k), given by equation 8, can also be expressed in terms of the innovation covariance $S(k) = H(k)P(k|k-1)H^T(k) + R(k)$, as $K(k) = P(k|k-1)H^T(k)S^{-1}(k)$.

In equations 13–16, the quantity $P_D$ is the so-called probability of detection, and is pre-determined; it is the probability that the correct measurement is obtained. It is specified a priori by a user of the positioning system. There are many ways to evaluate $P_D$; it can be evaluated statistically, analytically, or heuristically (trial and error). Since a measurement will always have some error associated with a condition impeding the measurement, such as an inability to see all of the satellites or base stations all of the time because of blockage or equipment failures including receiver malfunctions, in practice $P_D$ will never be equal to unity.

The quantity $P_G$ is a so-called gate probability. It is a factor used to restrict the normal distribution of the measurement innovation based on the width of a validation gate. If there is no pre-validation of measurements, so that any measurement is provided to the Kalman filter, then $P_G$ has a value of one, corresponding to a gate of infinite width. $P_G$ has a value of less than one when measurements too far from a predicted measurement are ejected. Using such a value for $P_G$ amounts to eliminating the edges of the normal distribution of the measurements. Values of $P_G$ of less than one are found from a chi-square tail probability tables as a function of the measurement dimension $n_z$ (i.e. the number of degrees of freedom of the measurement, which for only a range measurement is one, and for a combined range and Doppler measurement is two) and the width $\gamma$ of the validation gate (taking $\gamma$ as the value of the tail probability). Using g to denote $\sqrt{\gamma}$, (g therefore equal to a number of standard deviations), g can be pre-determined to have a value limiting the accepted measurement to only ⅔ of any set of measurements, on average. In the present invention, as indicated in FIG. 2, it is the value of g that is pre-determined, and from which the value of $P_G$ is inferred.

The volume V(k) of the validation region is defined as:

$$V(k) = c_{n_z} g^{n_z} |S(k)|^{1/2} \tag{17}$$

(using $g=\sqrt{\gamma}$) in which $$c_{n_z} = \frac{\pi^{n_z/2}}{\Gamma(n_z/2 + 1)}, \tag{18}$$

where $\Gamma(\alpha)$ is the gamma function (so that, e.g. $\Gamma(n+1)=n!$ for where n is an integer). $c_{n_z}$ can also be interpreted to as the volume of the $n_z$-dimensional unit hypersphere. Thus, e.g. $c_1=2$; $c_2=\pi$; $c_3=4\pi/3$, etc. Equation 18 is the general expression for $c_{n_z}$.

With the association probabilities $\beta_i(k)$ determined according to equations (13) and (16), a combined innovation $\nu(k)$ is determined, according to:

$$\nu(k) = \sum_{i=1}^{m(k)} \beta_i(k) \nu_i(k) \tag{19}$$

and used to update the state of the process, according to equation 9, i.e. as in a standard Kalman filter.

Although the update to the state of the process is calculated as usual, the covariance associated with the updated state, i.e. the a posteriori estimate error covariance, p(k+1), is calculated differently than in a standard Kalman filter, i.e. not according to equation (11). Instead, it is obtained using:

$$P(k) = \beta_0(k) P(k|k-1) + [1-\beta_0(k)] P^c(k) + \tilde{P}(k) \tag{20}$$

where $P^c(k)$ is the covariance of the state updated with the assumed to be correct measurement (i.e. it is the covariance of the state evaluated with $\beta_0(k)$ is set to zero), and is given by $$P^c(k) = P(k|k-1) + K(k) S(k) K^T(k) \tag{21}$$

and where $\tilde{P}(k)$ is the spread of innovations, given by $$\tilde{P}(k) = K(k) \left[ \sum_{i=1}^{m(k)} \beta_i(k) \nu_i(k) \nu_i^T(k) - \nu(k)\nu^T(k) \right] K^T(k). \tag{22}$$

Thus, the weighting of measurements in a Kalman filter, given by equation (20) and intended to correspond to the reliability of the measurements, is different in the PDA-modified Kalman filter of the present invention, given by equation (11). In fact, the weighting differs from the standard Kalman filter weighting in that it is more responsive to changes in the reliability of the measurements. This greater responsiveness by a PDA-modified Kalman filter is prudent because the PDA-modified Kalman filter will reject measurements that are too far from what is expected, so that giving greater credence to the remaining measurements is sensible. The modified weighting is thus more appropriate for measurements provided by different measurement sources, such as both satellites and cellular base stations. To significantly alter the weighting in a standard Kalman filter, it is usually necessary to use some means external to the Kalman filter, or else to reinitialize the Kalman filter. In the preferred embodiment in which the PDA-modified filter is implemented as software, the cost of the greater responsiveness is a slightly greater computational load, compared to a standard Kalman filter.

Kalman Filter-based Positioning System With Pre-Validation

Still referring to FIG. 2, in another aspect of a positioning system according to the present invention, a pre-validation of measurements is performed by a pre-validation module using a pre-determined (finite) value of g corresponding to a finite gate width $\gamma$, using the same notation as above. In performing the pre-validation, the measurements are assumed to be normally distributed, having a probability density function, $$p(z(k+1)|Z(k)) = N[z(k+1); \hat{z}(k+1|k), S(k+1)] \tag{23}$$

where again Z(k) is the set of all previous measurements, of any dimension, up to the $k^{th}$ instant, and where $\hat{z}(k+1|k)$, called the measurement prediction, is merely shorthand for the term $H(k+1)\hat{x}(k+1|k)$, as in. e.g. equation (10). Next, a validation region is defined, based on the above-described gate parameter gamma, that changes with each instant k of time; it is given by, $$V(k+1,\gamma) = \{z(k+1): [z(k+1)-\hat{z}(k+1|k)]^T S^{-1}(k+1)[z(k+1)-\hat{z}(k+1|k)] \leq \gamma\} \tag{24}$$

where $S^{-1}(k+1)$ is the inverse of the innovation covariance, and where $\gamma$ is again, as above, a pre-defined threshold obtained from the one-sided chi square distribution. Again denoting $\sqrt{\gamma}$ by g, equation (24) is also sometimes written as, $$\nu^T(k+1) S^{-1} \nu(k+1) \leq g^2 \tag{25}$$

where, as above, $\nu(k+1)$ is the measurement innovation, i.e. $z(k+1)-\hat{z}(k+1|k)$.

There is a certain probability that a measurement will fall in the validation region. The value of g is pre-determined to affect such a probability: the greater the value of g, the greater the probability that a measurement will fall in the validation region. If, for a particular measurement, the left-hand side of equation (25) evaluates to an amount greater than $g^2$, the measurement is declared an outlier, and is not used by the Kalman filter in making its next estimate of position (state of the process).

Thus, in the present invention, one assumes a Gaussian probability density function for measurements, with a width determined by the value of g, a value that can be set based on one or more of various considerations, as discussed above.

It is important to note that some of the terms in the above PDA and g-sigma gate equations are directly obtained from the Kalman filter used in estimating position. It is also important to note that the use of PDA weighting does not exclude using signal to nose ratios (SNRs), bit error rates (BERs), or other inputs for outlier rejection or measurement weighting.

Although in the preferred embodiment the pre-validation and PDA-modified state update are performed in the positioning system itself, it is also important and in fact in some implementations desirable to have the pre-validation, the PDA-modified state update and the time update, or more usually only the PDA-modified state update and the time update, performed by a computing facility that is separate and apart from the positioning system, and may be in only radio communication with the positioning system.

Figure 3:
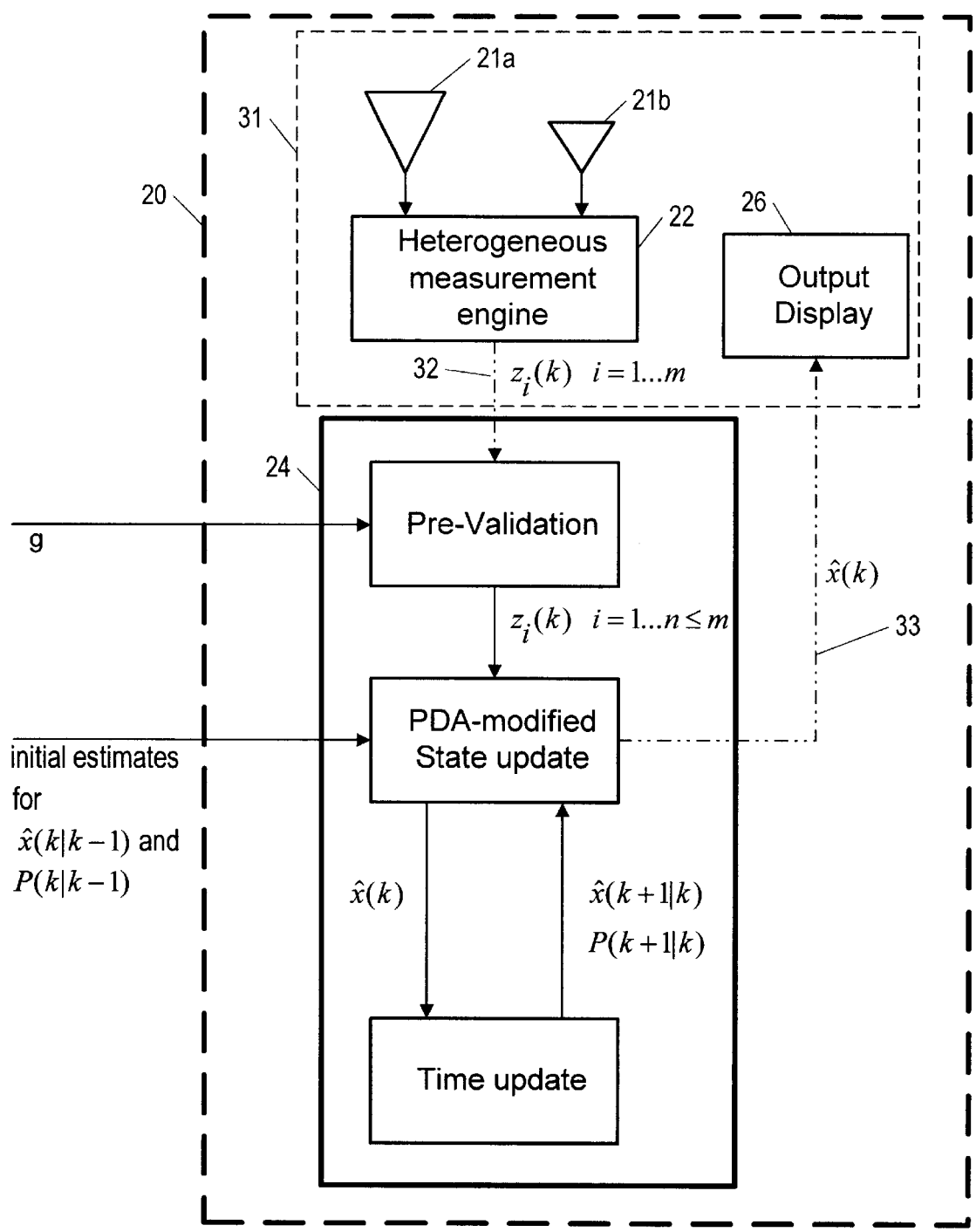
FIG. 3 is a flow diagram/block diagram of a distributed positioning system similar to the system of FIG. 2 but with some components remote from the object making use of the positioning system.

Thus, referring now to FIG. 3, a distributed positioning system according to the present invention is shown as including local components 31 moving with the user and also including non-local components 24, the filtering hardware modules, hosted by a remote facility. The non-local components 24 perform the filtering computations of the present invention, and are in only radio communication with the local modules 31 of the positioning system, the heterogeneous measurement engine 22 and the output display 26. The radio communication is indicated by the dashed lines 32 representing radio communication signals by which the outputs of the heterogeneous measurement system are provided to the filter modules 24, and by the dashed lines 33 representing radio communication signals by which the outputs of the filter modules 24 are provided to the output display 26. (The antennae and associated receiver and transmitter hardware needed to accomplish the indicated radio communications are implied.) In such an embodiment, the non-local components 24 perform the filtering computations for not only a particular positioning system with local components 31, but also for other positioning systems, not shown, also having only some components on-board the object making use of the positioning system. In some applications, the non-local components 24 would be part of a telecommunications network that would communicate with each different positioning system using a protocol similar to what is used in cellular telephone communications.

Figure 4:
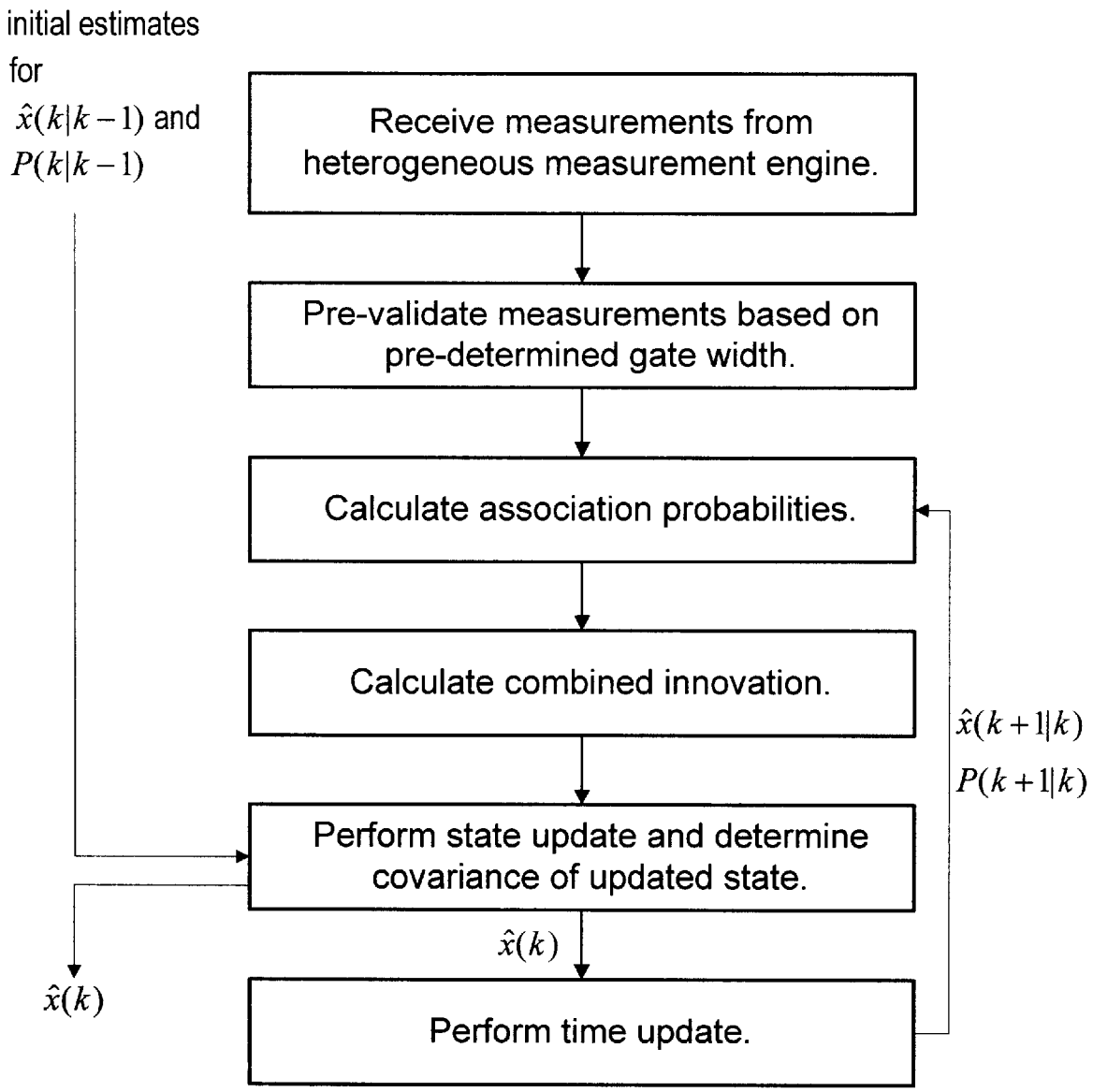
FIG. 4 is a flowchart of a method of filtering measurements of state information, according to the present invention.

Referring now to FIG. 4, a method is shown for filtering state measurements, according to the present invention, so as to obtain estimates of state information.

It is to be understood that the above-described arrangements are only illustrative of the application of the principles of the present invention. In particular, the present invention can be used as part of various kinds of filters in a positioning system, not only filters that might be referred to as Kalman filters; as indicated above, it comprehends any kind of filter in a position-measuring system that produces an estimate of position based on statistical measures involving current and previous measurements of position, or in other words, that statistically determines a succession of position estimates along with corresponding uncertainty estimates based on a succession of measurements. Further, a positioning system according to the present invention will not, of course, always yield an estimate of position, since in some situations there will not be adequate measurement data due, for example, to environmental affects that temporarily prevent receiving data from the number of sources needed to estimate position. In such a case, the positioning system might temporarily estimate only a heading and a clock bias.

It should also be clear that the present invention applies equally well to systems that are not, strictly, positioning systems, but instead are systems that in general estimate one or another aspect of the motion of an object, position being only one aspect. In case of estimating position, the system may aptly be called a "positioning system," even though it may estimate values for other aspects of the motion. But in other cases the aspect of the motion that is most important may be other than position; it may, for example, be angular velocity, or linear or angular acceleration, or simply linear velocity. In general, therefore, the present invention is for use as part of a system that is most aptly described as a generalized positioning system, and is to be understood to encompass estimating, in some applications, position, but in other applications, other aspects of motion, not necessarily including position.

In addition, numerous modifications and alternative arrangements of the embodiments disclosed here may be devised by those skilled in the art without departing from the spirit and scope of the present invention, and the appended claims are intended to cover such modifications and arrangements.

What is claimed is:

1. An improved generalized positioning system, for making estimates of state information of an object, the state information being information about the state of motion of the object, having a filter that statistically determines a succession of state estimates along with corresponding uncertainty estimates based on a succession of state measurements, the improvement comprising:

a) means for determining association probabilities for a plurality of state measurements all at a same instant of time, each association probability corresponding to a particular state measurement at the instant of time, and also means for determining an association probability providing a value for the probability that none of the plurality of measurements is correct;

b) means for combining into a single measurement innovation each individual innovation using the association probabilities as weightings; and c) means for determining the covariance of the updated state based on the individual association probabilities, the association probability for providing a value for the probability that none of the measurements is correct, and the combined measurement innovation.

2. The improved generalized positioning system of claim 1, wherein the filter is responsive to measurements provided by a measurement engine receiving information from both satellites and cellular base stations.

3. The improved generalized positioning system of claim 2, wherein the means for determining the association probability at a $k^{th}$ instant of time for a $j^{th}$ measurement out of m(k) state measurements is represented by $\beta_j(k)$ and is given by $$\beta_j(k) = e_j(k)\left[b(k) + \sum_{i=1}^{m(k)} e_i(k)\right]^{-1}$$

for j=1 . . . m(k), where $$e_j(k)=P_G^{-1}N[v_j(k);0,S(k)],$$

in which $P_G$ is a gate probability, N{ } denotes the normal distribution, $v_j(k)$ is the measurement innovation for the $j^{th}$ measurement, and S(k) is the innovation covariance at instant k, given by $$S(k)=H(k)P(k|k-1)H^T(k)+R(k),$$

in which H(k) relates the actual state of motion to the measured state of motion, P(k|k−1) is an a priori estimate error covariance, and R(k) is the measurement error covariance, and where $$b(k)=m(k)(1-P_DP_G)[P_DP_GV(k)]^{-1}$$

in which V(k) is the volume of a validation region, and $P_D$ is a probability of detection; and further wherein the means for determining an association probability providing a value for the probability that none of the plurality of measurements is correct is represented by $\beta_0(k)$ and is given by $$\beta_0(k) = b(k)\left[b(k) + \sum_{j=1}^{m(k)} e_j(k)\right]^{-1}.$$

4. The improved generalized positioning system of claim 1, wherein the filter is responsive to a finite gate width γ of a validation region, and wherein the filter rejects a state measurement if the state measurement falls outside the validation region.

5. The improved generalized positioning system of claim 4, wherein the filter is responsive to state measurements provided by a measurement engine receiving information from both satellites and cellular base stations.

6. The improved generalized positioning system of claim 5, wherein the validation region is defined by $$V(k+1,\gamma)=\{z(k+1):[z(k+1)-\hat{z}(k+1|k)]^T S^{-1}(k+1)[z(k+1)-\hat{z}(k+1|k)]\leq\gamma\}$$

for some predetermined value of the gate width γ, in which $\hat{z}(k+1|k)$ is a prediction of a next state measurement, and z(k+1) is the next state measurement.

7. The improved generalized positioning system of claim 1, wherein the filter is a Kalman filter.

8. The improved generalized positioning system of claim 1, further comprising a heterogeneous measurement engine and an output display that are each co-located with the object for which the state information is to be estimated, and further wherein the means for determining association probabilities, the means for combining into a single measurement innovation each individual innovation, and the means for determining the covariance of the updated state are all hosted by a non-local facility, one that is separate and remote from the object for which the state information is to be estimated, and wherein the non-local facility and the heterogeneous measurement engine and the output display are in radio communication.

9. A method, for use in making estimates of state information of an object, the state information being information about the state of motion of the object, the method for performing a filtering that statistically determines a succession of state estimates along with corresponding uncertainty estimates based on a succession of state measurements, the method comprising the steps of:

a) determining association probabilities for a plurality of state measurements all at a same instant of time, each association probability corresponding to a particular state measurement at the instant of time, and also determining an association probability providing a value for the probability that none of the plurality of measurements is correct;

b) combining into a single measurement innovation each individual innovation using the association probabilities as weightings; and c) determining the covariance of the updated state based on the individual association probabilities, the association probability for providing a value for the probability that none of the measurements is correct, and the combined measurement innovation.

10. The method of claim 9, wherein the filtering is of measurements provided by a measurement engine receiving information from both satellites and cellular base stations.

11. The method of claim 10, wherein the determining of the association probability at a $k^{th}$ instant of time for a $j^{th}$ measurement out of m(k) state measurements is represented by $\beta_j(k)$ and is given by $$\beta_j(k) = e_j(k)\left[b(k) + \sum_{i=1}^{m(k)} e_i(k)\right]^{-1}$$

for j=1 . . . m(k), where $$e_j(k)=P_G^{-1}N[v_j(k);0,S(k)],$$

in which $P_G$ is a gate probability, N{ } denotes the normal distribution, $v_j(k)$ is the measurement innovation for the $j^{th}$ measurement, and S(k) is the innovation covariance at instant k, given by $$S(k)=H(k)P(k|k-1)H^T(k)+R(k),$$

in which H(k) relates the actual state of motion to the measured state of motion, P(k|k−1) is an a priori estimate error covariance, and R(k) is the measurement error covariance, and where $$b(k)=m(k)(1-P_DP_G)[P_DP_GV(k)]^{-1}$$

in which V(k) is the volume of a validation region, and $P_D$ is a probability of detection; and further wherein the determining of an association probability providing a value for the probability that none of the plurality of measurements is correct is represented by $\beta_0(k)$ and is given by $$\beta_0(k) = b(k)\left[b(k) + \sum_{j=1}^{m(k)} e_j(k)\right]^{-1}.$$

12. The method of claim 9, wherein the filtering uses a finite gate width γ of a validation region, and wherein the method further comprises the step of rejecting a state measurement if the state measurement falls outside the validation region.

13. The method of claim 12, wherein the filtering is of state measurements provided by a measurement engine receiving information from both satellites and cellular base stations.

14. The method of claim 13, wherein the validation region is defined by $$V(k+1,\gamma)=\{z(k+1):[z(k+1)-\hat{z}(k+1|k)]^T S^{-1}(k+1)[z(k+1)-\hat{z}(k+1|k)] \leq \gamma\}$$

for some predetermined value of the gate width $\gamma$, in which $\hat{z}(k+1|k)$ is a prediction of a next state measurement, and $z(k+1)$ is the next state measurement.

15. The method of claim 9, wherein the filtering is as performed by a Kalman filter.

16. A filter, for making estimates of state information of an object, the state information being information about the state of motion of the object, the filter statistically determining a succession of state estimates along with corresponding uncertainty estimates based on a succession of state measurements, the filter comprising:
   a) means for determining association probabilities for a plurality of state measurements all at a same instant of time, each association probability corresponding to a particular state measurement at the instant of time, and also means for determining an association probability providing a value for the probability that none of the plurality of measurements is correct;
   b) means for combining into a single measurement innovation each individual innovation using the association probabilities as weightings; and
   c) means for determining the covariance of the updated state based on the individual association probabilities, the association probability for providing a value for the probability that none of the measurements is correct, and the combined measurement innovation.

17. The filter of claim 16, wherein the filter is responsive to measurements provided by a measurement engine receiving information from both satellites and cellular base stations.

18. The filter of claim 17, wherein the means for determining the association probability at a $k^{th}$ instant of time for a $j^{th}$ measurement out of $m(k)$ state measurements is represented by $\beta_j(k)$ and is given by $$\beta_j(k) = e_j(k)\left[b(k) + \sum_{i=1}^{m(k)} e_i(k)\right]^{-1}$$

for j=1 ... m(k), where $$e_j(k)=P_G^{-1} N[v_j(k);0,S(k)].$$

in which $P_G$ is a gate probability, $N\{\ \}$ denotes the normal distribution, $v_j(k)$ is the measurement innovation for the $j^{th}$ measurement, and $S(k)$ is the innovation covariance at instant k, given by $$S(k)=H(k)P(k|k-1)H^T(k)+R(k),$$

in which H(k) relates the actual state of motion to the measured state of motion, P(k|k−1) is an a priori estimate error covariance, and R(k) is the measurement error covariance, and where $$b(k)=m(k)(1-P_D P_G)[P_D P_G V(k)]^{-1}$$

in which V(k) is the volume of a validation region, and $P_D$ is a probability of detection; and further wherein the means for determining an association probability providing a value for the probability that none of the plurality of measurements is correct is represented by $\beta_0(k)$ and is given by $$\beta_0(k) = b(k)\left[b(k) + \sum_{j=1}^{m(k)} e_j(k)\right]^{-1}.$$

19. The filter of claim 16, wherein the filter is responsive to a finite gate width $\gamma$ of a validation region, and wherein the filter rejects a state measurement if the state measurement falls outside the validation region.

20. The filter of claim 19, wherein the filter is responsive to state measurements provided by a measurement engine receiving information from both satellites and cellular base stations.

21. The filter of claim 20, wherein the validation region is defined by $$V(k+1,\gamma)=\{z(k+1):[z(k+1)-\hat{z}(k+1|k)]^T S^{-1}(k+1)[z(k+1)-\hat{z}(k+1|k)] \leq \gamma\}$$

for some predetermined value of the gate width $\gamma$, in which $\hat{z}(k+1|k)$ is a prediction of a next state measurement, and $z(k+1)$ is the next state measurement.

22. The filter of claim 16, wherein the filter is a Kalman filter.

23. The filter of claim 16, further comprising a heterogeneous measurement engine and an output display that are each co-located with the object for which the state information is to be estimated, and further wherein the means for determining association probabilities, the means for combining into a single measurement innovation each individual innovation, and the means for determining the covariance of the updated state are all hosted by a non-local facility, one that is separate and remote from the object for which the state information is to be estimated, and wherein the non-local facility and the heterogeneous measurement engine and the output display are in radio communication.

* * * * *

UNITED STATES PATENT AND TRADEMARK OFFICE
CERTIFICATE OF CORRECTION

PATENT NO. : 6,618,690 B1　　　　　　　　　　　　　　　　　　　　　　　Page 1 of 1
DATED　　　 : September 9, 2003
INVENTOR(S) : Jari Syrjärinne It is certified that error appears in the above-identified patent and that said Letters Patent is hereby corrected as shown below:

Column 1,
Line 4, please insert,
-- Cross Reference To Related Application
　　Reference is made to co-filed U.S. application entitled METHOD AND APPARATUS FOR FILTERING MEASUREMENTS USED IN A GENERALIZED POSITIONING SYSTEM, attorney docket no. 944-001.009, filed on Nov. 22, 1999, with U.S. Express Mail No. EL 381 226 393 US.
　　Reference is also made to co-filed U.S. application entitled MULTIPLE-MODEL NAVIGATION FILTER WITH HYBRID POSITIONING, attorney docket no. 944-001.011, filed on Nov. 22, 1999, with U.S. Express Mail No. EL 381 226 380 US. --

Column 6,
Line 7, "22b" should be -- 21b --.

Signed and Sealed this

Seventeenth Day of August, 2004

JON W. DUDAS
*Acting Director of the United States Patent and Trademark Office*